United States Patent [19]

Platt

[11] Patent Number: 4,918,664
[45] Date of Patent: Apr. 17, 1990

[54] APPARATUS AND METHOD FOR PRESERVING DATA INTEGRITY IN MULTIPLE-PORT RAMS

[75] Inventor: Paul E. Platt, Starkville, Miss.

[73] Assignee: Cypress Semiconductor, San Jose, Calif.

[21] Appl. No.: 298,472

[22] Filed: Jan. 18, 1989

[51] Int. Cl.$^4$ .................................................. G11C 8/00
[52] U.S. Cl. ............................. 365/230.05; 365/233.5
[58] Field of Search .................... 365/230.5, 233.5, 233

[56] References Cited

U.S. PATENT DOCUMENTS 4,742,493 5/1988 Lewallen et al. ................ 365/233.5

Primary Examiner—Joseph A. Popek
Attorney, Agent, or Firm—Blakely, Sokoloff, Taylor & Zafman

[57] ABSTRACT

The invention relates to a random access memory having more than one port capable of accessing the same storage addresses. It provides a system for protection of data integrity at each port. First and second ports are capable of providing first and second address transition signals to enable data storage in a single memory address. A comparator is coupled to the first and second ports (1) for detecting address transitions indicating that the second port is addressing a particular memory address coincidentally when the first port also is addressing the same memory address, and (2) for generating a busy output signal for that address in the event of such coincidence. A transition detection circuit is used to detect the transition resulting from the removal of the busy output signal from the comparator and for providing a busy removal output signal equivalent to an address detection signal in the event of such detection. Finally, the busy removal output signal is combined with the transition detection signals, whereby the data from the second port may be written into the single memory address irrespective of whether the second port itself provides an address transition signal at that time.

4 Claims, 2 Drawing Sheets

APPARATUS AND METHOD FOR PRESERVING DATA INTEGRITY IN MULTIPLE-PORT RAMS

BACKGROUND AND FIELD OF THE INVENTION

This invention is in the field of multi-port dynamic and static random access memories (DRAMs and SRAMs). Many current generation random access memories, particularly SRAMs, are being designed with multiple ports. Such devices have the advantage of providing access to the memory from several places in a system at the same time, making them much more flexible. This is advantageous in system design except when it causes contention problems because more than one port is attempting to write to the same memory address at the same time. In the case of such contention, one port may try to write one set of data into the address and another port a different set of data.

What is required is a graceful arbitration scheme so that the first port to attempt to write to the address is successful, and any subsequent port is forced to wait until the first port is finished writing. It is disastrous if both ports can write at the same time, which may cause the selected address to have some bits of its stored data sent by one port and other bits sent by another. This will cause an error. Furthermore, it is important that a second port attempting to read data while a first port is writing is either told to wait until the writing is complete, or is somehow signaled that the data it may be reading from that memory address is not the most up-to date data. Conflicts of this nature are called address contention.

Circuitry used to prevent such address contention is called arbitration circuitry. In the prior art, arbitration circuits, or arbiters, have used a comparator which compares the addresses selected by each port. When the arbiter detects a match, it then makes a decision as to which port asked for the selected address first.

After making that decision, the arbiter sends a busy signal to the second port seeking that address, indicating that the selected address is busy. Problems with these arbiters still arise if both ports select the same address at the same time. If the arbiter does not find matching addresses from more than one port, it needs to take no action. It only sends out a busy signal to the second port in the event of a match.

Recently introduced memory devices use address transition detection (ATD) circuitry to activate storage and retrieval of information. ATD substitutes for a clock to set up the memory for a read or a write operation. The memory learns that one or another port seeks to read from or write data into an address by sensing an address transition signal. An address transition signal is a change signal from the state where no access to an address is desired, to the state where access to that address is desired. It is the transition in state which signals to the memory that access to an address is sought.

ATD type memories have a problem using arbiter circuits of the prior art. If one port desires to write data into, or to read data out of a particular address, but the selected address is busy, after the arbiter receives the transition signal from the port seeking access, it sends a busy signal back to that port. When the busy condition terminates, of course, the second port is free to read or to write data into the formerly busy address of the memory. However, at that time, the second port is no longer transitioning from the non-seeking to the seeking state. Accordingly, it is no longer providing the required address transition signal indicating its desire to access the desired address. Therefore, in spite of the desired memory address now being free for access, the second port will not be capable of gaining access to it. To overcome this problem, memory circuits of the prior art require that the system design insures that when a port attempting to access an address was turned away because the address was busy, the system must first go to a different address and then come back to the formerly busy address. In that way, upon returning to the formerly busy address, the necessary transition signal will be regenerated, indicating a desire to access that address. Provided the address is then available, access will be permitted.

The problem with these system constraints required by the prior art memory circuits is the delay time encountered in going to a different address and coming back. This slows down average memory access time. If the user's program happens to generate a great deal of address contention (and many do), the part will be slowed considerably. Moreover, this system constraint of going away from a busy address and coming back makes the part incompatible with competitive parts which do not use address transition detection circuitry and thus do not place this constraint on the system.

BRIEF DESCRIPTION OF THE INVENTION

The multi-port random access memory of this invention provides a system for arbitrating address contention from multiple ports without requiring the later seeking port to move to a different address and then move back to the busy port. Accordingly, the multi-port memories of this invention are particularly suitable for ATD circuitry and are capable of faster arbitration and offer full compatibility with plug compatible memories which do not use ATD.

Briefly, the system for protection of data integrity at each port of a multi port random access memory, according to this invention, includes first and second ports capable of providing first and second address transition signals to enable data storage in a single memory address. The system uses a comparator coupled to the first and second ports (1) for detecting address transitions indicating that a second port is addressing a particular memory address coincidentally when a first port is addressing the same memory address, and for (2) generating busy output signal for that address in the event of such coincidence. An additional transition detector is employed to detect the transition resulting from the removal of the busy output signal from the comparator and for providing a busy removal output signal in the event of such detection. Finally, the busy removal output signal from the additional transition detector is combined with the address transition signals from the second port, whereby the data from the second port may be written into the single memory address irrespective of whether the second port itself is providing an address transition signal at that time.

The busy removal output signal of the invention is equivalent to an address detection signal. Accordingly, it is not necessary for the second port to seek a different memory address and come back to the originally busy port in order to provide the necessary address transition signal to the address being sought. This results in faster memory access, and enables the memory of the inven-

DETAILED DESCRIPTION OF THE INVENTION

Figure 1:
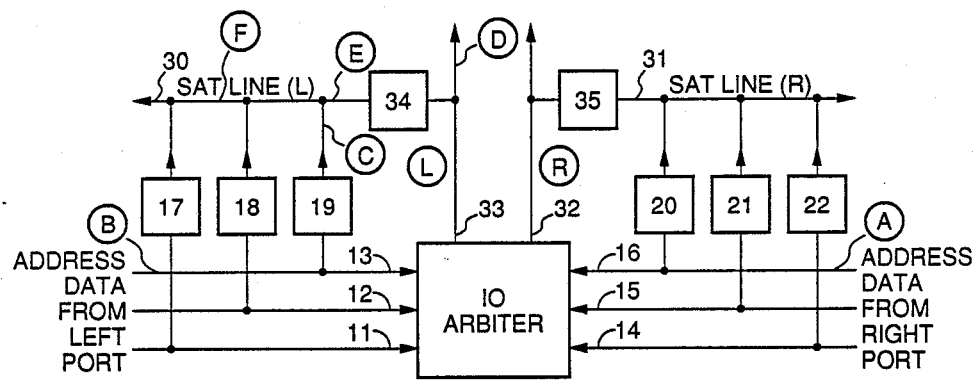
FIG. 1 is a block diagram of the memory system of the invention.

Referring to FIG. 1, arbiter 10 is a comparator which compares addresses of the memory being accessed. For illustrative purposes of FIG. 1, arbiter 10 has three bit lines 11, 12 and 13 from the pins of the left port of the memory and three lines 14, 15 and 16 from the addresses of the right port. Memories, may use any number of address pins, the combination of the signals on which designate the selected address. The arbiter must have a sufficient number of input lines to accomodate the number of pins designating address.

The current generation of memories, particularly CMOS static random access memories (SRAMs), do not operate by sensing the actual state of a pin on a port, but instead detect the transition from one voltage level to the other. This technique is called address transition detection (ATD). The memory of this invention uses ATD. The address transitions from the three lines 11, 12 and 13 of the left port are sensed by address transition detectors 17, 18 and 19, respectively. Similarly, the address transitions from the right port on lines 14, 15 and 16 are sensed by address transition detectors 20, 21 and 22 respectively. A transition on any one of lines 11, 12 and 13 is sufficient to send an address transition signal to address transition detectors 17, 18 or 19, respectively, and the detection of an address transition by any one of these three (or more) address transition detectors will place an address transition detection (ATD) signal on left sense address transition (SAT) line 30. Similarly, signals from any one of ATDs 20, 21 and 22 will place an address transition signal on SAT line 31.

The function of arbiter 10 is to determine whether or not the address selected by the left port is the same address as has been selected at the same time by the right port. In other words, the addresses on lines 11, 12 and 13 are compared with the respective addresses on lines 14, 15 and 16. If they are identical, a busy output signal is sent on line 33. Arbiter 10 is a comparator capable of making a determination of which port, left or right, was first to select the common address. If arbiter 10 determines, for example, that the left port was the first port seeking the same address as is being sought by the right port, a "busy" output signal will appear on line 32, the right busy line. This tells the right port that the address it seeks is unavailable. Similarly, if arbiter 10 determines that the right port was the first port to seek the same address, it sends a busy output signal onto left busy line 33, telling the left port that it cannot access the sought-after address because it is busy.

In accordance with this invention, the left busy output signal (the one which indicates that the right port has priority) is sent to a additional ATD 34 which in turn outputs onto SAT line 30. The output signal from ATD 34 represents a busy removal output signal which, in signal structure, is equivalent to an address detection signal from any one of ATDs 17, 18 or 19. Similarly, the busy removal signal from ATD 35 which outputs onto the right SAT line 31 is equivalent in structure to an ATD signal from any one of ATDs 20, 21 or 22, also coupled to SAT line 31.

The busy output signal on line 33 is available to the system as a whole, usually through an output pin of the memory device. In this manner, the system will know that a busy condition has occurred and can handle it accordingly. As discussed above, in prior art ATD systems, the port accessing the busy address must be transferred to another address and then transferred back to the original address in order to generate the required ATD signal. To the contrary, with systems using the memory of the subject invention, the data which is desired to be stored in the selected busy address, or the signal indicating a desire to read the selected busy address, is held somewhere in the system until the busy output signal on line 33 goes away, triggering a busy removal signal from ATD 34 Access to the busy address will immediately become possible the moment the busy removal signal appears. This fast access results in a faster part.

Figure 2:
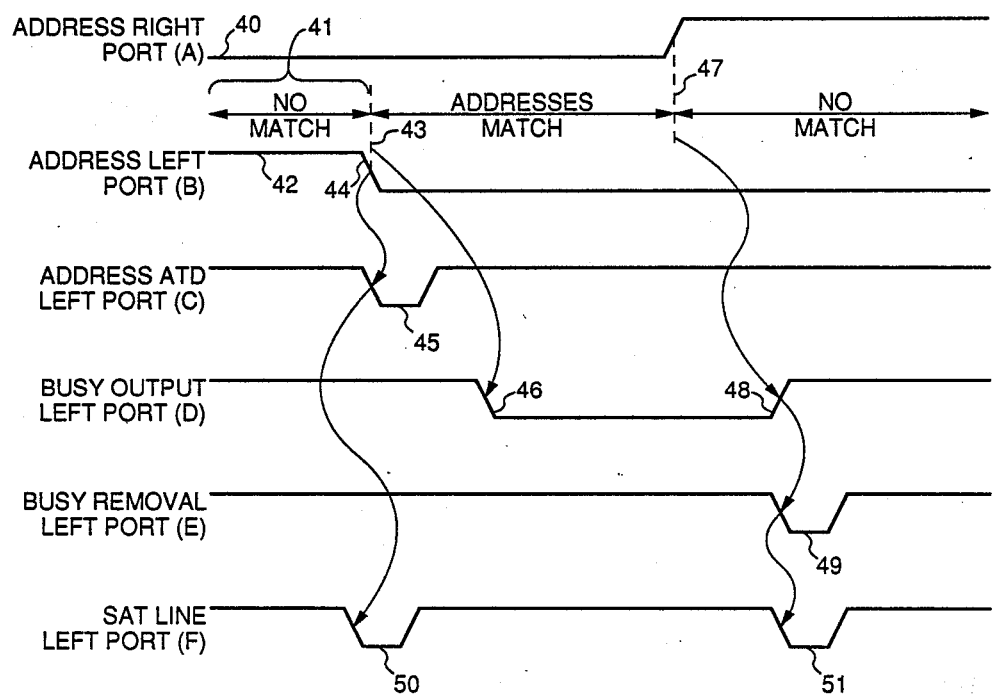
FIG. 2 is a graph depicting the timing of the signals which are used in the operation of the system of the invention.

The operation of the invention will be better understood by looking at the block diagrams of FIG. 1 together with the graphs of FIG. 2. The signals are named in the left column of FIG. 2 using reference letters A-F which also appear at the points labeled A-F in FIG. 1.

For the purposes of this example, it is assumed that the first-addressing port is the right port, which therefore has priority. For purposes of illustration, the address signal on line 16, labeled A, will be used. For the first part of the cycle shown by signal 40 in FIG. 2, it is assumed that comparator 10 finds no match between the actual address comprising the voltage levels on lines 14, 15 and 16 (as illustrated by the voltage level at point A on line 16), and the levels on the comparable address lines of the left port. For that reason, the first portion 41 of signal 40 is labeled "no match".

During this same portion of the cycle, left address line 13, illustrated by signal 42 in FIG. 2, represents a non-matching address signal. At vertical dotted line 43, signal 42 from the left port changes from high to low, and at that time matches the level of signal 40 from the right port. Although the signals on lines 13 and 16 in FIG. 1 are the only ones discussed for the purposes of this illustration, it is of course assumed that all of the signals on the left address port, appearing on lines 11, 12 and 13, match the signals on the opposite right port, appearing on lines 14, 15 and 16. The transition of signal 42 from a high to a low state results in an output signal from ATD 19 appearing at point C in FIG. 1. This signal is shown as signal 44 in FIG. 2. The address transition detection signal at point C in FIG. 1 resulting from the high-to-low change 44 is pulse 45.

The matching of the addresses which occurs after transition 44, indicating that the left port is seeking the same address that is already being accessed by the right port, as indicated on line 43, results in arbiter 10 sending a busy output signal 46 on line 33, the left busy output signal line, at point D. This signal is available to the system to indicate that the left port is seeking a busy address.

Returning to the top signal 40 in FIG. 2, a second transition 47 occurs when this signal 40 goes from a low to a high state. This transition is from a match to a no match condition, as shown. Note after transition 47 that the low level signal 42, coincident with the high level signal 40, results in the prior match condition no longer existing. As a result of the match going away, the busy output signal at point D on line 33, as shown at point 48 in FIG. 2, also goes away. When the busy output signal on line 33 goes away, a busy removal signal is generated by ATD 34 at point E in FIG. 1, and this signal is shown in FIG. 2 as pulse 49.

As viewed from SAT line 30 at point F on FIG. 1, the ATD signal 45 at point C appeared on SAT line 30 at point F and is shown in FIG. 2 as signal 50. The busy removal signal which appeared at point E from ATD 34 is shown as pulse 51 in FIG. 2 as it appeared on SAT line 30. It will be apparent from viewing the pulses at point F on SAT line 30 shown in FIG. 2 that pulses 49 and 50 ar equivalent signals. In memories using ATD, these Sense Address Transition (SAT) signals substitute for a clock and are used to initiate read or write operations.

Figure 3:
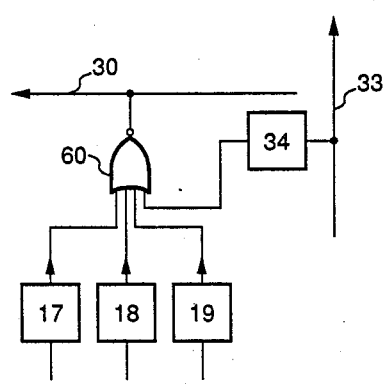
FIG. 3 is a block diagram of one port according to the preferred embodiment of the present invention.

In a preferred embodiment of the invention, as shown in FIG. 3, ATDs 17, 18 and 19 are fed into a NOR-gate 60, whose output is connected to SAT line 30, as shown. Busy signal line 33 is fed through additional ATD 34 which is connected as an additional input to NOR-gate 60, as shown. Whenever a transition is detected by any of the illustrated three ATDs 17, 18 or 19, or a busy removal signal is outputted from ATD 34, NOR-gate 60 will send a address transition signal to SAT line 30, which will be sensed and acted upon accordingly.

The invention has been described in connection with the preferred embodiments illustrated in the drawings. It will be apparent to those skilled in the art that many modifications can be made in the invention using well known circuit modifications without departing from the spirit and scope of the invention, as is defined only by the claims which follow.

I claim:

1. In a random access memory having more than one port capable of accessing the same storage addresses, a system for protection of data integrity at each port comprising:
    first and second ports capable of providing first and second address transition signals to enable data storage in a single memory address;
    a comparator means coupled to said first and second ports (1) for detecting address transitions indicating that said second port is addressing a particular memory address coincidentally when said first port is addressing the same memory address and for (2) generating a busy output signal for that address in the event of such coincidence;
    a transition detection means for detecting the transition resulting from the removal of said busy output signal from said comparator and for providing a busy removal transition signal equivalent to an address detection signal in the event of such detection; and
    means for logically ORing said busy removal transition signal from said transition detection means with the address transition signal from said second port, whereby, in response to an output from said combining means, the data from said second port may then be written into or read out of said single memory address irrespective of whether said second port itself is providing an address transition signal at that time.

2. In a random access memory having more than one port capable of accessing the same storage addresses, a system for protection of data integrity at each port comprising:
    first and second ports capable of providing first and second address transition signals to enable data storage in a single memory address:
    sense line means for logically ORing the address transition signals from said second port;
    a comparator means coupled to said first and second ports (1) for detecting address transitions indicating that said second port is addressing a particular memory address coincidentally when said first port is addressing the same memory address and for (2) generating a busy output signal for that address in the event of such coincidence; and
    a transition detection means for detecting the transition resulting from the removal of said busy output signal from said comparator and for providing a busy removal transition signal equivalent to an address transition signal to said sense line in the event of such detection, whereby, in response to an output from said combining means, the data from said second port may then be written into or read out of said single memory address irrespective of whether said second port itself is providing an address transition signal to said sense line at that time.

3. The random access memory of claim 2 wherein each port has associated sense line means for combining the address transition signals at that port.

4. In a random access memory having more than one port capable of accessing the same storage addresses, the method of protecting data integrity at each port comprising;
    providing first and second address transition signals to two separate ports to enable data storage in a single memory address;
    detecting coincident address transitions from said first and second ports indicating that said second port is addressing a particular memory address while said first port is addressing the same memory address;
    generating a busy output signal for said particular memory address in the event of detection of such coincidence;
    detecting the transition resulting from the completion of said busy output signal from said comparator;
    providing a busy removal output signal equivalent to an address detection signal in the event of such detection; and
    logically ORing said busy removal transition signal with the address transition signals from said second port, whereby, in response to an output from said combining means, the data from said second port may then be written into or read out of said single memory address irrespective of whether said second port itself is providing an address transition signal at that time.

* * * * *